US010211424B2

(12) United States Patent
Cheong

(10) Patent No.: US 10,211,424 B2
(45) Date of Patent: Feb. 19, 2019

(54) MULTI-VISION DISPLAY APPARATUS INCLUDING FLEXIBLE DISPLAY PANEL

(71) Applicant: LG Display Co., Ltd., Seoul (KR)

(72) Inventor: NuRi Cheong, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/984,666

(22) Filed: Dec. 30, 2015

(65) Prior Publication Data

US 2017/0032763 A1 Feb. 2, 2017

(30) Foreign Application Priority Data

Jul. 31, 2015 (KR) .................. 10-2015-0109100

(51) Int. Cl.
| | |
|---|---|
| *G09G 5/14* | (2006.01) |
| *H01L 27/32* | (2006.01) |
| *H01L 51/52* | (2006.01) |
| *G09G 3/3225* | (2016.01) |
| *G02F 1/1333* | (2006.01) |
| *G02F 1/1335* | (2006.01) |

(52) U.S. Cl.
CPC ...... *H01L 51/5253* (2013.01); *G02F 1/13336* (2013.01); *G02F 1/133305* (2013.01); *G02F 1/133528* (2013.01); *G09G 3/3225* (2013.01); *H01L 27/3262* (2013.01); *H01L 27/3293* (2013.01); *H01L 51/5271* (2013.01); *H01L 51/5281* (2013.01); *G09G 2300/026* (2013.01); *H01L 2251/5338* (2013.01)

(58) Field of Classification Search
CPC .......... G09G 5/14; G09G 3/3225; G09G 3/32; G09G 3/3208; H01L 27/3262; H01L 27/3293; H01L 51/5253; H01L 51/5271; H01L 51/5281; H01L 51/5257; G06F 3/1446; G06F 3/1423; G06F 3/1431; G06F 3/1438; G02F 1/133305; G02F 1/13336; G02F 1/133528
See application file for complete search history.

(56) References Cited

U.S. PATENT DOCUMENTS

| | | | |
|---|---|---|---|
| 8,941,555 B2* | 1/2015 | Yoo | G09G 3/3208 345/1.1 |
| 2010/0277064 A1* | 11/2010 | Cok | H01L 27/3293 313/506 |
| 2013/0169515 A1* | 7/2013 | Prushinskiy | G06F 1/1652 345/55 |
| 2014/0078778 A1* | 3/2014 | Moriwaki | G09F 9/3026 362/610 |
| 2014/0132488 A1 | 5/2014 | Kim et al. | |
| 2014/0138713 A1* | 5/2014 | Pillarisetty | H01L 51/5253 257/88 |

FOREIGN PATENT DOCUMENTS

CN 103810945 A 5/2014

* cited by examiner

*Primary Examiner* — Sardis F Azongha
(74) *Attorney, Agent, or Firm* — Dentons US LLP

(57) ABSTRACT

A multi-vision display apparatus includes a plurality of flexible display panels attached to one polarizing film attached to first surfaces of the plurality of flexible display panels. Non-display areas of a flexible substrate of each of the plurality of flexible display panels may be bent in a direction away from the polarizing film and are attached to the corresponding flexible display panel. An image is output through the first surfaces of the flexible display panels and the polarizing film.

7 Claims, 7 Drawing Sheets

MULTI-VISION DISPLAY APPARATUS INCLUDING FLEXIBLE DISPLAY PANEL

CROSS-REFERENCE TO RELATED APPLICATIONS

This application claims the benefit of the Korean Patent Application No. 10-2015-0109100 filed on Jul. 31, 2015, which is hereby incorporated by reference for all purposes as if fully set forth herein.

BACKGROUND

Field of the Disclosure

The present disclosure relates to a multi-vision display apparatus including a plurality of flexible display panels.

Discussion of the Related Art

A large multi-vision display apparatus may be located inside a building, on an outer wall or a rooftop of a building, billboard, or any other location suitable for advertisement and/or the like.

FIG. 1 is an exemplary diagram illustrating a front surface of a related art multi-vision display apparatus, and FIG. 2 is an exemplary diagram illustrating a cross-sectional surface taken along line A-A' of FIG. 1.

In order to manufacture the related art multi-vision display apparatus, elements such as a thin film transistor (TFT), an organic light emitting diode (OLED), and/or the like are first disposed on a glass substrate, and an organic light emitting display substrate is manufactured.

A plurality of organic light emitting display panels 10 and 20 are manufactured by cutting the manufactured organic light emitting display substrate.

For example, as illustrated in FIG. 2, a first organic light emitting display panel 10 includes a first panel 11, which includes a glass substrate, a TFT, and an OLED, and a first polarizing film 12 attached to the first panel 11. Also, a second organic light emitting display panel 20 includes a second panel 21, which includes a glass substrate, a TFT, and an OLED, and a second polarizing film 22 attached to the second panel 21.

As illustrated in FIG. 2, the first organic light emitting display panel 10 is bonded to the second organic light emitting display panel 20 by an adhesive 30 coated on a side surface of each of the first organic light emitting display panel 10 and the second organic light emitting display panel 20.

For example, when nine organic light emitting display panels are bonded by the method and then are fastened to various instruments, the tiled multi-vision display apparatus illustrated in FIG. 1 is manufactured.

In this configuration of the multi-vision display apparatus illustrated in FIG. 1, an area illustrated as a dotted line represents boundary areas between adjacent organic light emitting display panels, and in more detail, represents an area on which the adhesive 30 illustrated in FIG. 2 is present.

In FIGS. 1 and 2, M1 represents a total width of the non-display area. Moreover, in FIG. 2, reference numeral X1 refers to a non-display area of the first organic light emitting display panel 10, and reference numeral X2 refers to a non-display area of the second organic light emitting display panel 20.

As described above, the related art multi-vision display apparatus includes a plurality of organic light emitting display panels each including a glass substrate. For this reason, the related art multi-vision display apparatus is very heavy, and consequently, the ability to move this display is very limited.

Moreover, because the related art multi-vision display apparatus uses a glass substrate having rigid characteristics, the related art multi-vision display apparatus may only be attached to a limited space such as a flat wall surface or the like.

Moreover, in the related art multi-vision display apparatus, because the two organic light emitting display panels 10 and 20 are bonded by the adhesive 30, a gap corresponding to a thickness of the adhesive 30 exists between the two bonded organic light emitting display panels 10 and 20. Due to the gap between the two organic light emitting display panels 10 and 20 and the non-display area of each of the organic light emitting display panels 10 and 20 forming a window-frame type border of non-display area, there is a visual distraction in implementing one super multi-vision display apparatus as boundary areas in the visual image are dark and break-up the image.

To provide an additional description, in the related art multi-vision display apparatus, the non-display areas X1 and X2 are respectively provided in two adjacent organic light emitting display panels, and a gap is formed between the two organic light emitting display panels due to the adhesive 30. For this reason, in the super multi-vision display apparatus, a size of a display area displaying an image is relatively reduced.

SUMMARY

Accordingly, the present disclosure is directed to provide a multi-vision display apparatus including a plurality of flexible display panels that substantially obviates one or more problems due to limitations and disadvantages of the related art.

An aspect of the present disclosure is directed to provide a multi-vision display apparatus including a plurality of flexible display panels attached to one polarizing film.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a multi-vision display apparatus including a plurality of flexible display panels and a polarizing film attached to first surfaces of the plurality of flexible display panels. In this case, non-display areas of each of the plurality of flexible display panels attached to the polarizing film may be bent in a direction opposite to the polarizing film and may be attached to the plurality of flexible display panels, and an image may be output through the first surfaces and the polarizing film.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION OF THE DISCLOSURE

Reference will now be made in detail to the exemplary embodiments of the present disclosure, examples of which are illustrated in the accompanying drawings. Wherever possible, the same reference numbers will be used throughout the drawings to refer to the same or like parts.

Hereinafter, exemplary embodiments of the present disclosure will be described in detail with reference to the accompanying drawings.

A multi-vision display apparatus including a flexible display panel according to an embodiment of the present disclosure may be manufactured by using various kinds of display panels such as an organic light emitting display panel, a plasma display panel, a liquid crystal display panel, an electrophoretic display panel, and/or the like. Hereinafter, for convenience of description, a multi-vision display apparatus including a flexible organic light emitting display panel will be described as an example of a multi-vision display apparatus including a flexible display panel according to an embodiment of the present disclosure.

Figure 3:
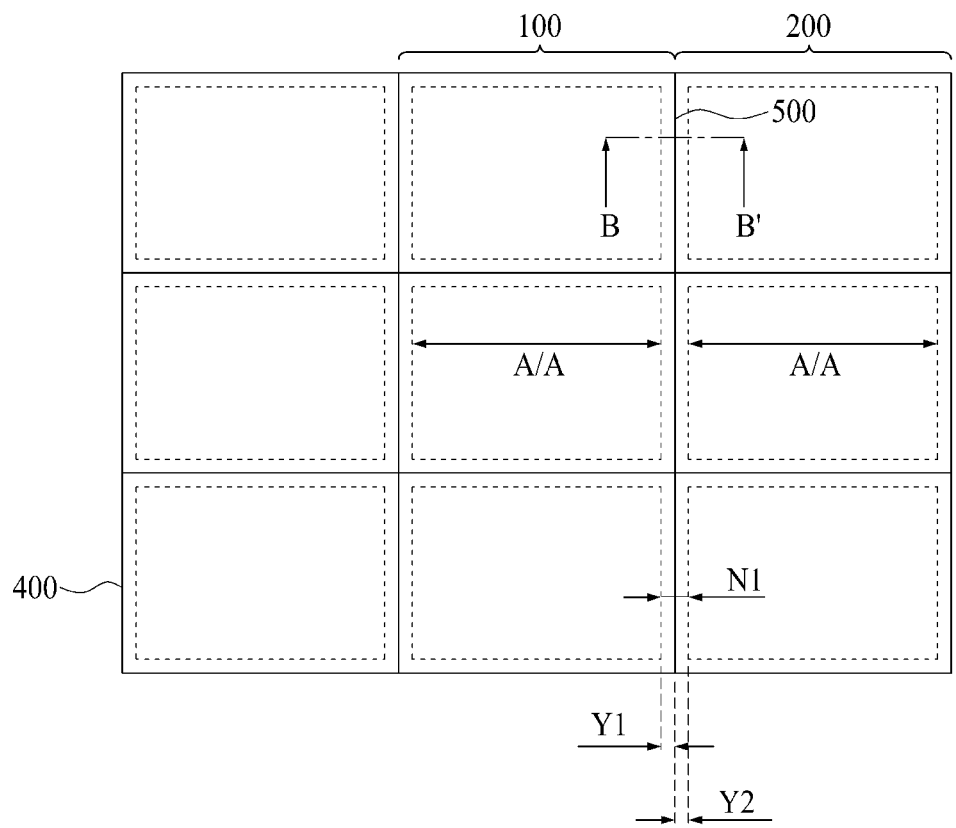
FIG. 3 is an exemplary diagram illustrating a front surface of a multi-vision display apparatus including a flexible display panel according to an embodiment of the present disclosure.
Figure 4:
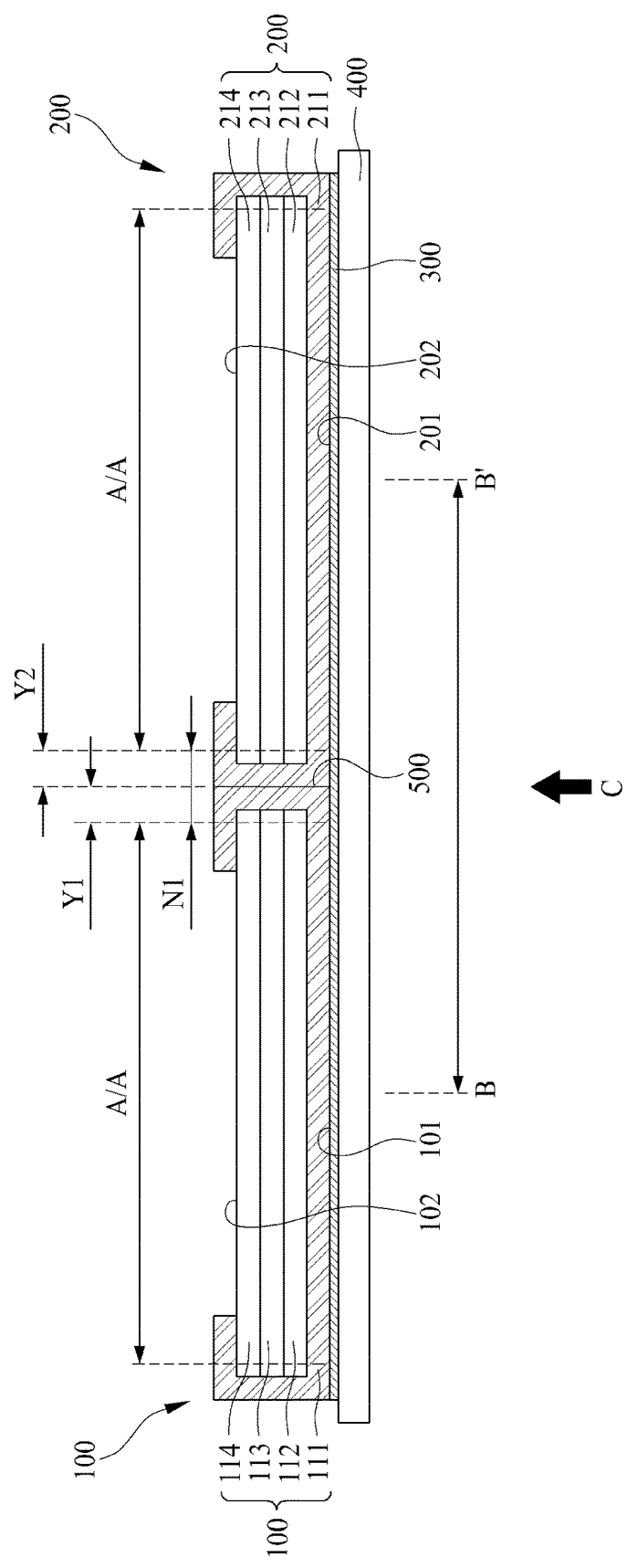
FIG. 4 is an exemplary diagram illustrating a cross-sectional surface taken along line B-B' of FIG. 3.

FIG. 3 is an exemplary diagram illustrating a front surface of a multi-vision display apparatus including a flexible display panel according to an embodiment of the present disclosure, and FIG. 4 is an exemplary diagram illustrating a cross-sectional surface taken along line B-B' of FIG. 3 and extended.

The multi-vision display apparatus including a flexible display panel according to an embodiment of the present disclosure, as illustrated in FIGS. 3 and 4, may include a plurality of flexible display panels 100 and 200 and a polarizing film 400 attached to each of first surfaces 101 and 201 of the flexible display panels 100 and 200.

A non-display area N1 of the flexible display panel 100 (200) attached to the polarizing film 400 may be bent in a direction opposite to the polarizing film 400 and may be attached to the flexible display panel 100 (200).

The polarizing film 400 prevents light input from the outside of the flexible display panel 100 (200) from being reflected by organic light emitting display panels and transferred to a viewer's eyes.

In this case, an image may be output through the first surface 101 (201) of the flexible display panel 100 (200) and the polarizing film 400.

For example, a multi-vision display apparatus including nine flexible display panels in a 3×3 matrix is illustrated in FIG. 3.

In order to manufacture the multi-vision display apparatus with an organic light emitting display substrate according to an embodiment of the present disclosure, elements such as a thin film transistor (TFT), an organic light emitting diode (OLED), and/or the like may be disposed on a flexible mother substrate formed of a flexible polymer material such as polyimide (PI) and/or the like.

The individual organic light emitting display panels 100 and 200 may be manufactured by cutting the manufactured organic light emitting display substrate. At this point, a polarizing film may not yet be attached to first and second organic light emitting display panels 100 and 200.

For example, as illustrated in FIG. 4, the first organic light emitting display panel 100 may include a first flexible substrate 111, a first TFT layer 112, and a first organic emission layer 113. Also, the second organic light emitting display panel 200 may include a second flexible substrate layer 211, a second TFT 212, and a second organic emission layer 213.

In this case, as illustrated in FIG. 4, a non-display area (hereinafter simply referred to as a first non-display area) of the first organic light emitting display panel 100 may be formed by bending the first flexible substrate 111 in a direction away from the first surface 101 and the polarizing film 400, wrapped around the sides of the first TFT and emission layers 112, 113, and to the rear of the first organic light emitting display panel 100.

Similarly, as illustrated in FIG. 4, a non-display area (hereinafter simply referred to as a second non-display area) of the second organic light emitting display panel 200 may be formed by bending the second flexible substrate 211 in a direction away from the first surface 201 and the polarizing film 400, wrapped around the sides of the second TFT and emission layers 212, 213, and to the rear of the second organic light emitting display panel 200.

The first organic light emitting display panel 100 and the second organic light emitting display panel 200, which are respectively manufactured by bending a plurality of the first non-display areas and a plurality of the second non-display areas through the process, may be attached to the polarizing film 400 through an adhesive 300.

In this configuration, a separate adhesive may be eliminated at a boundary surface between the first organic light emitting display panel 100 and the second organic light emitting display panel 200.

Therefore, in the multi-vision display apparatus illustrated in FIG. 3, an area illustrated as a solid line may represent a boundary area between two organic light emitting display panels, and for example, may be a boundary area between the first organic light emitting display panel 100 and the second organic light emitting display panel 200 illustrated in FIG. 4.

The first non-display areas of the first organic light emitting display panel 100 and the second non-display areas of the second organic light emitting display panel 200, as described above, may be bent in a direction opposite to the polarizing film 400. However, a portion of each of the first non-display areas of the first organic light emitting display panel 100 and a portion of each of the second non-display areas of the second organic light emitting display panel 200 may not be bent.

An area, which is not bent in the direction opposite to the polarizing film 400, and thus, is exposed through the polarizing film 400, among the first non-display areas, may be referred to as a first front non-display area Y1.

Moreover, an area, which is not bent in the direction opposite to the polarizing film 400, and thus, is exposed through the polarizing film 400, among the second non-display areas, may be referred to as a second front non-display area Y2.

An image may be output through the first surface 101 (201) of the flexible display panel 100 (200) and the polarizing film 400.

Therefore, FIG. 3 illustrates a multi-vision display apparatus as seen in a viewing direction C of FIG. 4.

For example, as illustrated in FIG. 3, nine organic light emitting display panels creating the multi-vision display apparatus may be adjacent to a boundary between a plurality of front non-display areas. A boundary surface 500 between the front non-display areas is illustrated as a solid line in FIGS. 3 and 4.

To provide a more detailed description, the first organic light emitting display panel 100 and the second organic light emitting display panel 200 may be attached to the polarizing film 400, and particularly, the first front non-display area Y1 of the first organic light emitting display panel 100 may be closely adhered to the second non-display area Y2 of the second organic light emitting display panel 200. In FIGS. 3 and 4, a boundary surface between the first front non-display area Y1 and the second non-display area Y2 is referred to by reference numeral 500.

In this case, in the multi-vision display apparatus, a size of an area (hereinafter simply referred to as a first multi-vision non-display area N1, illustrated in FIG. 3) on which an image is not displayed may be determined based on a width of the first front non-display area Y1 plus a width of the second front non-display area Y2.

For example, in FIG. 3, the first organic light emitting display panel 100 may include a display area A/A and the first front non-display area Y1, and the second organic light emitting display panel 200 may include a same display area A/A and the second front non-display area Y2. An image may be output through the display area A/A, but may not be output through the first front non-display area Y1 and the second front non-display area Y2.

If a width of the first front non-display area Y1 and a width of the second front non-display area Y2 are reduced, a width of the first multi-vision non-display area N1 may be reduced.

Particularly, a width of the first multi-vision non-display area N1 may be narrower than that of a multi-vision non-display area exposed to a front surface of a related art multi-vision display apparatus. Therefore, a size of each of multi-vision non-display areas exposed to a front surface of the multi-vision display apparatus according to an embodiment of the present disclosure may be smaller than that of each of multi-vision non-display areas exposed to the front surface of the related art multi-vision display apparatus.

For example, the first multi-vision non-display area Y1 may be an area other than areas that are bent in the direction opposite to the polarizing film 400, among the first non-display areas of the first organic light emitting display panel 100.

Moreover, the second multi-vision non-display area Y1 may be an area other than areas that are bent in the direction opposite to the polarizing film 400, among the second non-display areas of the second organic light emitting display panel 200.

Therefore, a portion of each of the first non-display areas and a portion of each of the second non-display areas may be exposed to the front surface of the multi-vision display apparatus according to an embodiment of the present disclosure.

Figure 1:
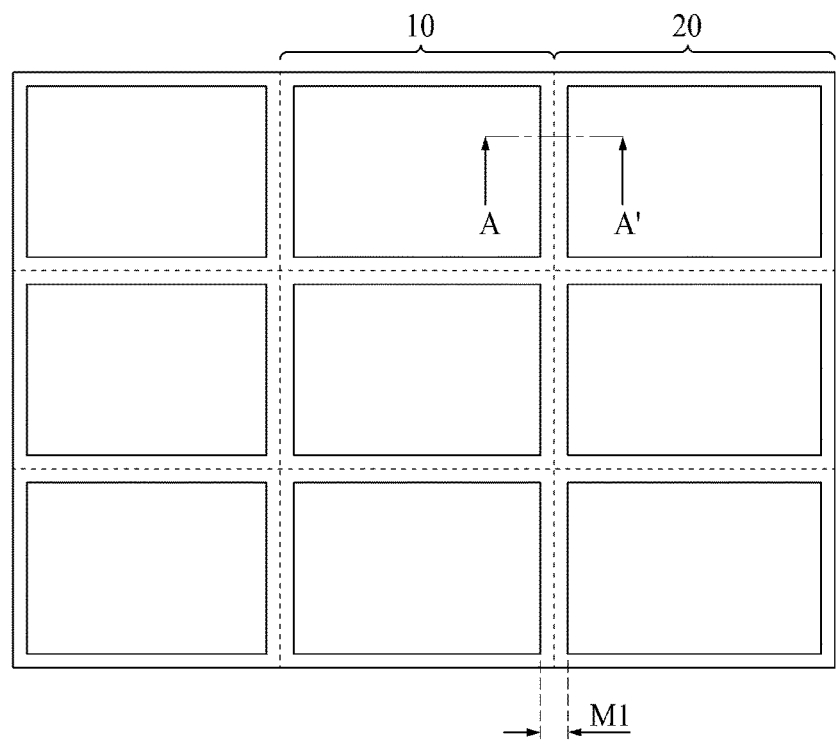
FIG. 1 is an exemplary diagram illustrating a front surface of a related art multi-vision display apparatus.
Figure 2:
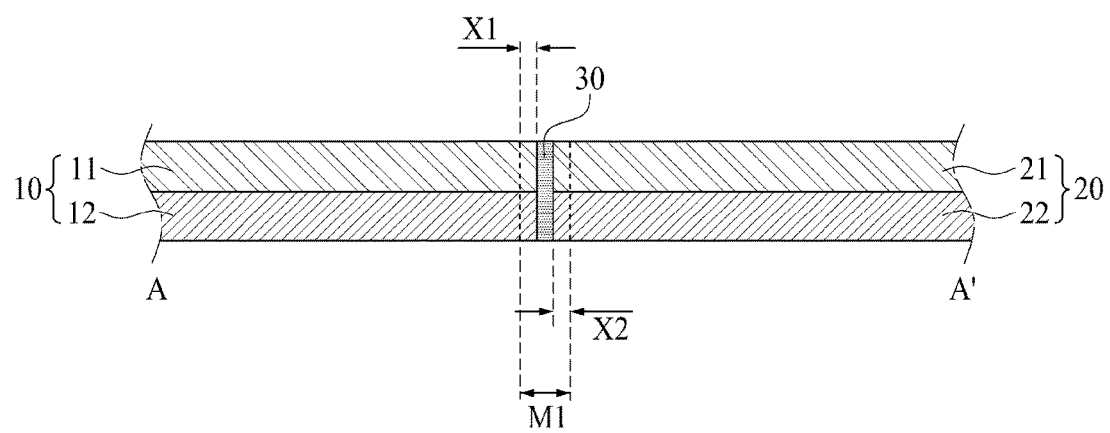
FIG. 2 is an exemplary diagram schematically illustrating a cross-sectional surface of the related art taken along line A-A' of FIG. 1.

On the other hand, all the non-display areas X1 of the first organic light emitting display panel 10 and all the non-display areas X2 of the second organic light emitting display panel 20 may be exposed to the front surface of the related art multi-vision display apparatus illustrated in FIGS. 1 and 2.

Therefore, a size of each of the multi-vision non-display areas exposed to the front surface of the multi-vision display apparatus according to an embodiment of the present disclosure may be less than that of each of the multi-vision non-display areas exposed to the front surface of the related art multi-vision display apparatus.

To provide an additional description, when it is assumed that a width of the first non-display area X1 of the first organic light emitting display panel 10 and a width of the second non-display area X2 of the second organic light emitting display panel 20 applied to the related art multi-vision display apparatus are the same as a width of the first non-display area of the first organic light emitting display panel 100 and a width of the second non-display area of the second organic light emitting display panel 200 applied to the multi-vision display apparatus according to an embodiment of the present disclosure, in the related art multi-vision display apparatus, as illustrated in FIGS. 1 and 2, a first multi-vision non-display area M1 provided in a boundary between the first organic light emitting display panel 10 and the second organic light emitting display panel 20 may include the first non-display area X1 of the first organic light emitting display panel 10, the second non-display area X2 of the second organic light emitting display panel 20, and the adhesive 30.

On the other hand, in the multi-vision display apparatus according to an embodiment of the present disclosure, as illustrated in FIGS. 3 and 4, the first multi-vision non-display area N1 provided in a boundary between the first organic light emitting display panel 100 and the second organic light emitting display panel 200 may include only the first front non-display area Y1, which is one of the first non-display areas, and the second front non-display area Y2 which is one of the second non-display areas.

Therefore, a width of the first multi-vision non-display area N1 of the multi-vision display apparatus according to an embodiment of the present disclosure may be less than that of the first multi-vision non-display area M1 of the related art multi-vision display apparatus.

Hereinabove, it has been described that an adhesive is not coated on the boundary surface between the first organic light emitting display panel 100 and the second organic light emitting display panel 200. However, an adhesive having a thickness which is thinner than an adhesive of the related art may be coated between the first organic light emitting display panel 100 and the second organic light emitting display panel 200.

Hereinafter, features of the above-described multi-vision display apparatus including a flexible display panel according to an embodiment of the present disclosure will be described.

Because a display panel including a glass substrate is not bendable, the related art multi-vision display apparatus is manufactured through a process of attaching side surfaces of display panels, each including a glass substrate, to each other with an adhesive. Therefore, a gap between the display panels may be wide. Accordingly, a size of an area on which is an image is not output is relatively large in the whole front surface of the multi-vision display apparatus. In this case, a width of a multi-vision non-display area defined by two adjacent display panels may be several millimeters (mm), for example 3.5 mm.

According to an embodiment of the present disclosure, because a plurality of flexible display panels are attached to one polarizing film having a large area, a multi-vision display apparatus may be manufactured where a size of a multi-vision non-display area on which an image is not displayed is reduced.

For example, the non-display areas of four surfaces of each of the flexible display panels 100, 200 may be bent, and then, front surfaces of the flexible display panels 101, 201 may be attached to one polarizing film 400 having a large area, whereby one multi-vision display apparatus may be manufactured. In this case, a width of a multi-vision non-display area defined by two adjacent display panels may be several micrometer (um), for example 30 um.

Hereinafter, a method of manufacturing a multi-vision display apparatus including a flexible display panel according to an embodiment of the present disclosure will be described with reference to FIGS. 3 to 5.

Figure 5A:
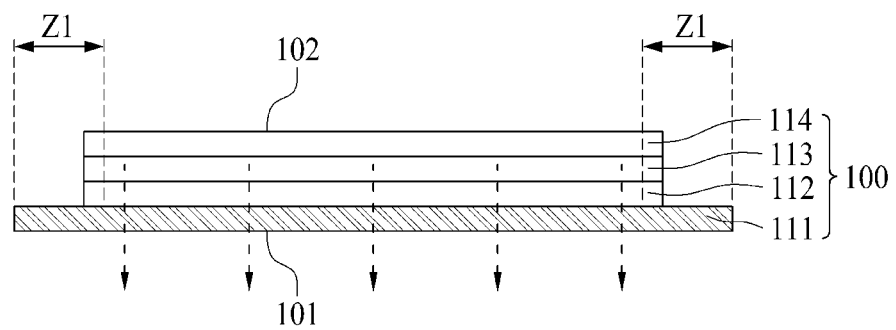
FIGS. 5A and 5B are cross-sectional views of a flexible display panel applied to a multi-vision display apparatus including a flexible display panel according to an embodiment of the present disclosure.
Figure 5B:
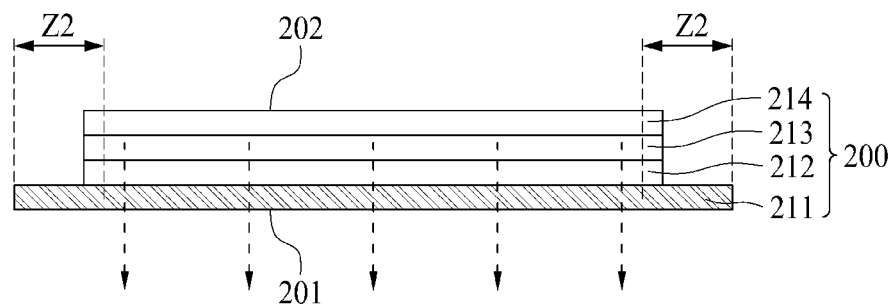
Figure 6A:
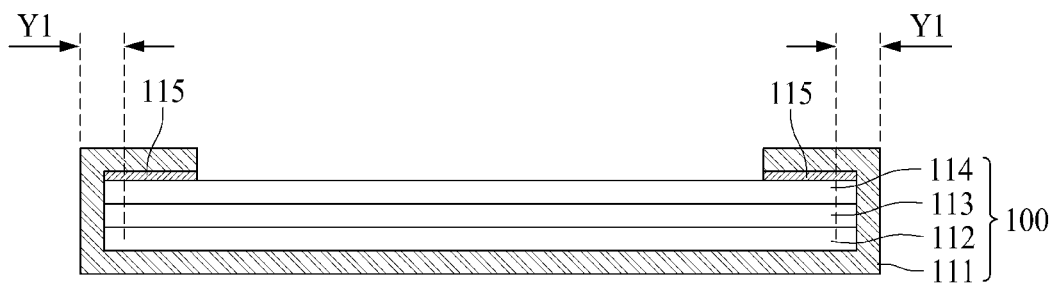
FIGS. 6A and 6B are exemplary diagrams for describing a method of bending a non-display area of the flexible display panel illustrated in FIGS. 5A and 5B.

FIGS. 5A and 5B are cross-sectional views of a flexible display panel applied to a multi-vision display apparatus including a flexible display panel according to an embodiment of the present disclosure. FIGS. 6A are 6B are exemplary diagrams for describing a method of bending a flexible substrate into non-display area of the flexible display panel illustrated in FIGS. 5A and 5B.

First, a flexible polymer substrate (hereinafter simply referred to as a flexible mother substrate) may be formed by coating a polymer material on a glass substrate, and a TFT and an organic emission layer may be formed on the flexible mother substrate, whereby a mother substrate may be formed.

Subsequently, the mother substrate which is manufactured through the above-described process may be cut to a size of a required flexible display panel.

Subsequently, the glass substrate may be separated from the cut flexible substrate, and thus, a plurality of flexible display panels may be manufactured. FIG. 5A illustrates a cross-sectional surface of the first flexible display panel 100 which is manufactured through the process, and FIG. 5B illustrates a cross-sectional surface of the second flexible display panel 200 which is manufactured through the process.

Here, as illustrated in FIGS. 4 and 5A, the first flexible display panel 100 may include the first flexible substrate 111, the first TFT layer 112, and the first organic emission layer 113.

Moreover, as illustrated in FIGS. 4 and 5B, the second organic light emitting display panel 200 may include the second flexible substrate 211, the second TFT layer 212, and the second organic emission layer 213.

The flexible substrate 111 (211) may be formed of a flexible polymer material such as polyimide (PI).

The TFT layer 112 (212) may be disposed on a first surface of the flexible substrate 111 (211). The TFT layer 112 (212) may include a plurality of TFTs.

The organic emission layer 113 (213) may be disposed on the TFT layer 112 (212). The organic emission layer 113 (213) may include a plurality of OLEDs. The OLEDs may be respectively driven by the TFTs included in the TFT layer 112 (212).

The OLEDs is vulnerable to moisture. Therefore, in the flexible display panel 100 (200), the organic emission layer 113 (213) may be sealed by a sealing material for preventing penetration of water and other contaminants.

At least one OLED may be included in each of a plurality of subpixels which are provided in the flexible display panel.

Moreover, in the flexible display panel 100 (200), a red color filter, a green color filter, a blue color filter, or other color filters having various colors may be respectively formed in the plurality of subpixels.

Particularly, the first flexible display panel 100 applied to a multi-vision display apparatus according to a first embodiment of the present disclosure may include a first reflector 114 disposed on the organic emission layer 113, and the second flexible display panel 200 applied to the multi-vision display apparatus according to the first embodiment of the present disclosure may include a second reflector 214 disposed on the organic emission layer 213. The reflector 114 (214) may reflect light, emitted from the organic emission layer 113 (213), toward the flexible substrate 111 (211).

To provide an additional description, the organic light emitting display panels may be categorized into a bottom emission type organic light emitting display panel, where light is output to a lower end surface of the organic light emitting display panel, and a top emission type organic light emitting display panel where light is output to an upper end surface of the organic light emitting display panel.

The first flexible display panel 100 and the second flexible display panel 200 applied to the multi-vision display apparatus according to the first embodiment of the present disclosure may each use a bottom emission type.

For example, the reflector 114 (214) included in the first flexible display panel 100 (the second flexible display panel 200) may reflect light, which is emitted from the organic emission layer 113 (213) and is transferred to the reflector 114 (214), toward the flexible substrate 111 (211). Therefore, the light may be output to a lower end surface (i.e., the flexible substrate 111 (211) of the first flexible display panel 100 (the second flexible display panel 200).

The first TFT layer 112 may be disposed on a second surface of the first flexible substrate 111 configuring the first flexible display panel 100, and a first surface of the first flexible substrate 111 may be attached to the polarizing film 400. The first and second surfaces of the first flexible substrate 111 may be opposite each other.

In this case, in the first flexible display panel 100, the surface 101 attached to the polarizing film 400 may be the first surface of the first flexible substrate 111. To provide an additional description, in the above-described flexible display panel, a surface attached to the polarizing film 400 may be the first surface 101, and in FIGS. 4 and 5A, the first TFT layer 112 may be on the second surface of the first flexible substrate 111. Therefore, the first surface 101 of the first flexible display panel denotes the first surface of the first flexible substrate 111.

Likewise, the second TFT layer 212 may be disposed on the second surface of the second flexible substrate 211 configuring the second flexible display panel 200, and the first surface of the second flexible substrate 211 may be attached to the polarizing film 400. The first and second surfaces of the second flexible substrate 211 may be opposite each other.

In this case, in the second flexible display panel 200, the first surface 201 attached to the polarizing film 400 denotes the first surface of the first flexible substrate 111.

Subsequently, as illustrated in FIGS. 5A and 6A, first non-display areas Z1 of the first flexible display panel 100 which is manufactured through the process may be bent in a direction toward the second surface 102 of the first flexible display panel and may be attached to the second surface 102.

The first and second surfaces 101 and 102 of the first flexible display panel 100 may be opposite each other.

For example, in the first flexible display panel 100, a surface attached to the polarizing film 400 may be referred to as a first surface 101. The first surface 101 may be a surface of the flexible substrate 111 of the first flexible display panel 100 illustrated in FIG. 5A. Also, the second surface 102 of the first flexible display panel 100 may be a surface opposite the first surface 101 in the first flexible display panel 100. Therefore, the second surface 102 of the first flexible display panel 100 may be an upper end surface of the first flexible display panel 100, illustrated in FIG. 5A.

A non-display area adhesive 115 may be coated on the second surface 102, for attaching the first flexible substrate non-display area Z1 to the second surface 102 of the first flexible display panel 100. In this case, as illustrated in FIG. 6A, the non-display area adhesive 115 may be coated on a whole surface attached to the first flexible substrate non-display area Z1, or may be coated on a portion of the whole surface attached to the first flexible substrate non-display area Z1.

In this case, the whole first flexible substrate non-display area Z1 may be attached to the second surface 102 of the first flexible display panel 100, but a portion of the first flexible substrate non-display area Z1 may be attached to the second surface 102 of the first flexible display panel 100.

A portion of the first flexible substrate non-display area Z1, which is exposed to the front surface of the multi-vision display apparatus through the polarizing film 400 without being attached to the second surface 102 of the first flexible display panel 100, may be referred to as the first front non-display area Y1.

A printed circuit board (PCB) (not shown) attached to the first flexible display panel 100 may be closely adhered to the second surface 102 of the first flexible display panel 100. The PCB may be electrically connected to a pad part included in the first flexible display panel 100 to supply various signals to a plurality of data lines and a plurality of gate lines which are formed in the first flexible display panel 100, and moreover, may supply a current or a voltage to various lines which are formed in the first flexible display panel 100.

Figure 6B:
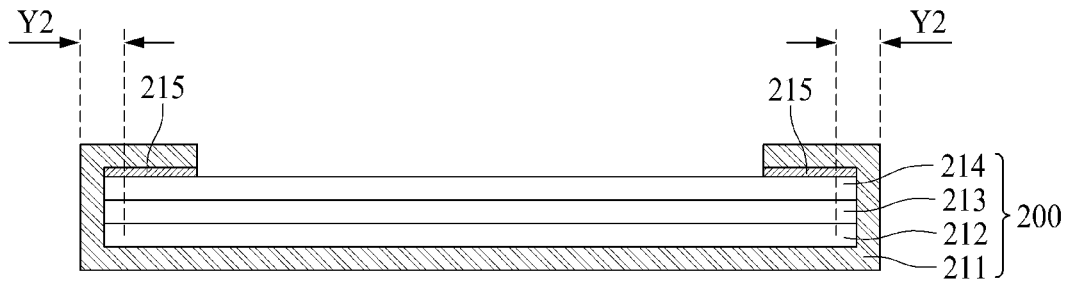

Likewise, as illustrated in FIG. 6B, second flexible substrate non-display areas Z2 of the second flexible display panel 200 which is manufactured through the process may be bent in a direction toward the second surface 202 of the second flexible display panel and may be attached to the second surface 202.

The first and second surfaces 201 and 202 of the second flexible display panel 200 may be opposite each other.

For example, as described with relation to the first flexible display panel 100 above, in the second flexible display panel 200, a surface attached to the polarizing film 400 may be referred to as a first surface 201. The first surface 201 may be a lower end surface of the second flexible display panel 200 illustrated in FIG. 5B. Also, the second surface 202 of the second flexible display panel 200 may be a surface opposite the first surface 201 in the second flexible display panel 200. Therefore, the second surface 202 of the second flexible display panel 200 may be an upper end surface of the second flexible display panel 200 illustrated in FIG. 5B.

A non-display area adhesive 215 may be coated on the second surface 202, for attaching the second flexible substrate non-display area Z2 to the second surface 202 of the second flexible display panel 200. In this case, as illustrated in FIG. 6B, the non-display area adhesive 215 may be coated on a whole surface attached to the second flexible substrate non-display area Z2, or may be coated on a portion of the whole surface attached to the second flexible substrate non-display area Z2.

In this case, the whole second flexible substrate non-display area Z2 may be attached to the second surface 202 of the second flexible display panel 200, but a portion of the second flexible substrate non-display area Z2 may be attached to the second surface 202 of the second flexible display panel 200.

A portion of the second flexible circuit non-display area Z2, which is exposed to the front surface of the multi-vision display apparatus through the polarizing film 400 without being attached to the second surface 202 of the second flexible display panel 200, may be referred to as the second front non-display area Y2.

A PCB (not shown) attached to the second flexible display panel 200 may be closely adhered to the second surface 202 of the second flexible display panel 200. The PCB may be electrically connected to a pad part included in the second flexible display panel 200 to supply various signals to a plurality of data lines and a plurality of gate lines which are formed in the second flexible display panel 200, and moreover, may supply a current or a voltage to various lines which are formed in the second flexible display panel 200.

The first organic light emitting display panel 100 and the second organic light emitting display panel 200, which are manufactured through the processes described above with reference to FIGS. 6A and 6B, may be attached to the polarizing film 400 as illustrated in FIG. 4.

In this case, the first surface 101 of the first organic light emitting display panel 100 and the first surface 201 of the second organic light emitting display panel 200 may be attached to the polarizing film 400.

In addition to the first organic light emitting display panel 100 and the second organic light emitting display panel 200, the other seven organic light emitting display panels creating the multi-vision display apparatus illustrated in FIG. 3 may be manufactured through the same method as the above-described method, and then may be attached to the polarizing film 400.

In this case, the adhesive 300 may be coated on the first surfaces of the organic light emitting display panels, or may be coated on the polarizing film 400.

However, if the adhesive 300 is already coated on or attached to the polarizing film 400, a separate adhesive coating process is not needed. In this case, the polarizing film 400 may be attached to the organic light emitting display panels by using a lamination process.

As described above, when the non-display area of each of the organic light emitting display panels is bent and is attached to a second surface of a corresponding organic light emitting display panel, a width of the front non-display area Y1 (Y2) exposed through the polarizing film 400 may be approximately less than a thickness of the flexible substrate 111 (211).

Therefore, the multi-vision non-display area of the multi-vision display apparatus according to an embodiment of the present disclosure which is manufactured through the above-described process may be smaller than the multi-vision non-display area of the related art multi-vision display apparatus.

Moreover, because the polarizing film 400 having a large area supports the flexible display panels, a stability of the multi-vision display apparatus is enhanced.

Hereinabove, the bottom emission type organic light emitting display panel has been described as an example of the flexible display panel according to an embodiment of the present disclosure.

However, the flexible display panel according to an embodiment of the present disclosure may have a top emission type.

Figure 7:
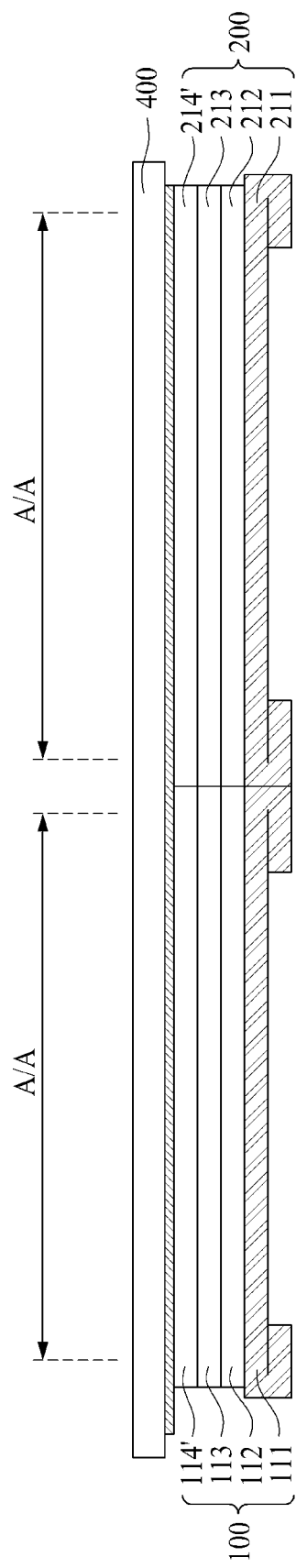
FIG. 7 is a cross-sectional view of a flexible display panel applied to a multi-vision display apparatus including a flexible display panel according to another exemplary embodiment of the present invention.

FIG. 7 is a cross-sectional view of a flexible display panel applied to a multi-vision display apparatus including a flexible display panel according to another exemplary embodiment of the present invention.

To provide an additional description, the first flexible display panel 100 and the second flexible display panel 200 applied to a multi-vision display apparatus according to a second embodiment of the present disclosure may have the top emission type.

In this case, the first flexible display panel 100 (the second flexible display panel 200), as shown in FIG. 7 may include a passivation layer 114' (214') disposed on the organic emission layer 113 (213). The passivation layer 114' (214') protects the organic emission layer 113 (213).

To provide an additional description, in FIGS. 4 to 6, reference numeral "114 (214)" refers to the reflector in the first embodiment of the present disclosure, and in the second embodiment of the present disclosure, as shown in FIG. 7, reference numeral "114' (214')" refers to the passivation layer.

The passivation layer 114' (214') may be formed of an inorganic material or an organic material, or may be formed of a complex layer which includes an inorganic material and an organic material.

In this case, light emitted from the organic emission layer 113 (213) may be output to the outside through the passivation layer 114' (214').

In the second embodiment of the present disclosure, a first surface of the passivation layer 114' (214') may contact an upper end of the organic emission layer 113 (213), and a second surface of the passivation layer 114' (214') may be opposite the first surface of the passivation layer 114' (214').

In this case, the first surface of the flexible display panel is the same as the second surface of the passivation layer 114' (214'). That is, the second surface of the passivation layer 114' (214') may be attached to the polarizing film 400.

Moreover, the non-display areas of the flexible display panel may be bent in a direction toward the second surface of the flexible display panel and may be attached to the second surface. In the second embodiment of the present disclosure, the first surface of the flexible display panel denotes an upper end surface of the passivation layer 114' (214'), and the second surface of the flexible display panel denotes the flexible substrate. In this case, the first and second surfaces of the flexible display panel may be opposite each other.

Figure 8:
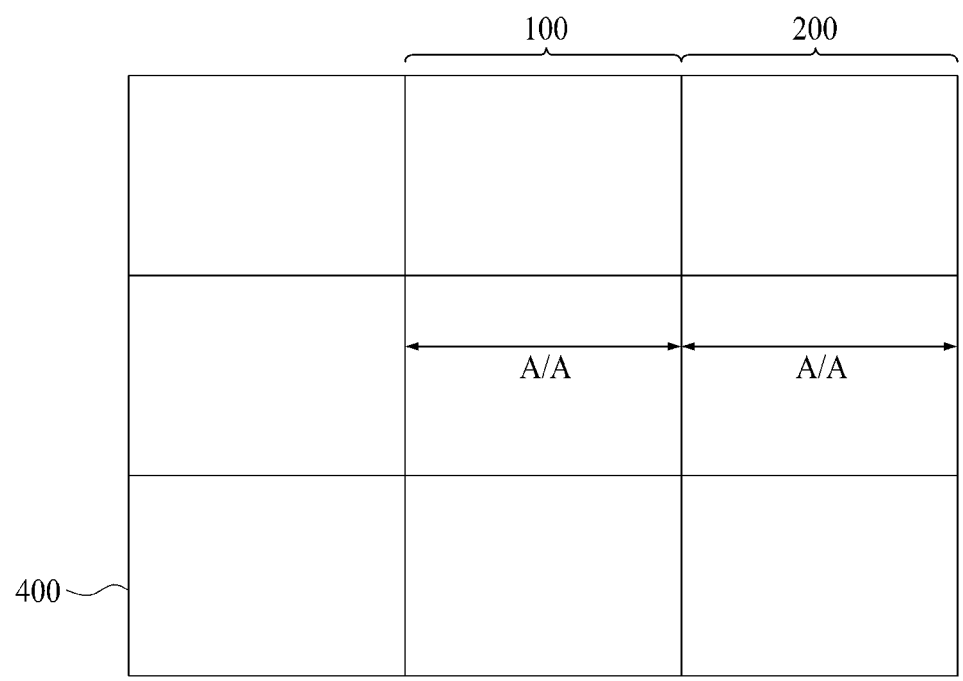
FIG. 8 is an exemplary diagram illustrating a front surface of a multi-vision display apparatus including a flexible display panel according to another exemplary embodiment of the present disclosure.

FIG. 8 is an exemplary diagram illustrating a front surface of a multi-vision display apparatus including a flexible display panel according to another embodiment of the present disclosure.

In a multi-vision display apparatus according to a third embodiment of the present disclosure, as shown in FIG. 8, a portion of each of the display areas A/A of the flexible display panel may be bent in the direction opposite to the polarizing film 400 along with the non-display areas and may be attached to the second surface of the flexible display panel.

For example, in the multi-vision display apparatus according to the first embodiment of the present disclosure illustrated in FIGS. 3 to 6, the non-display area (for example, a portion of the first non-display area Z1) may be attached to the second surface of the first flexible display panel 100. In this case, the first front non-display area Y1 corresponding to a portion of the first non-display area Z1 may be exposed to the outside through the polarizing film 400.

However, in the multi-vision display apparatus according to the third embodiment of the present disclosure, as shown in FIG. 8, the non-display area (for example, the whole first non-display area) and portions of the display area A/A adjacent to the first non-display area in the first flexible display panel 100 may be attached to the second surface of the first flexible display panel 100.

In this case, the multi-vision non-display area may not be provided in the multi-vision display apparatus at all.

For example, in the multi-vision display apparatus according to the first embodiment of the present disclosure illustrated in FIG. 3, the first multi-vision non-display area N1 which includes the first front non-display area Y1 and the second front non-display Y2 may be provided between the first flexible display panel 100 and the second flexible display panel 200. Also, in the multi-vision display apparatus according to the second embodiment of the present disclosure illustrated in FIG. 7, the first multi-vision non-display area which includes the first front non-display area and the second front non-display may be provided between the first flexible display panel 100 and the second flexible display panel 200

However, in the multi-vision display apparatus according to the third embodiment of the present disclosure, as shown in FIG. 8, an area corresponding to the first multi-vision non-display area may not be provided. Therefore, the display area of the first flexible display panel may be closely adhered to the display area of the second flexible display panel.

In this case, an image displayed by the multi-vision display apparatus is normally displayed by adjusting an image displayed by the first flexible display panel and an image displayed by the second flexible display panel.

To provide an additional description, a first image displayed by the first flexible display panel and a second image displayed by the second flexible display panel may be corrected in order for a normal image to be displayed on an area in which a bent portion of the display area of the first flexible display panel is adjacent to a bent portion of the display area of the second flexible display panel.

Therefore, the multi-vision non-display area may not be provided in the multi-vision display apparatus. Accordingly, a user can watch an image which is the same as an image displayed by one display device.

As described above, according to the embodiments of the present disclosure, the non-display areas of four surfaces of each of the flexible display panels may be bent, and then, the flexible display panels may be attached to one polarizing film having a large area. Accordingly, in the multi-vision display apparatus, an area on which an image is not displayed is minimized.

Moreover, according to the embodiments of the present disclosure, because one polarizing film having a large area is used, the processing cost is reduced.

Moreover, according to the embodiments of the present disclosure, one polarizing film having a large area may support a plurality of flexible display panels. Accordingly, the multi-vision display apparatus according to the embodiments of the present disclosure is more stable than the related art multi-vision display apparatus which is manufactured by coupling panels, attached to separate polarizing films, to each other with an adhesive.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A multi-vision display apparatus comprising:
   a plurality of flexible display panels, wherein each of the plurality of flexible display panels comprises a flexible substrate; and
   one polarizing film disposed on a first surface of the flexible substrate of each of the plurality of flexible display panels,
   wherein a thin film transistor (TFT) layer, an organic emission layer on the TFT layer, and a reflector on the organic emission layer are disposed on a second surface of the flexible substrate,
   the flexible substrate in non-display areas of each of the plurality of flexible display panels is bent in a direction away from the polarizing film to surround the TFT layer, the organic emission layer, and the reflector, and are attached to the corresponding flexible display panel,
   the flexible substrate of each of the plurality of flexible display panels is between the polarizing film and one of the thin film transistor (TFT) layer, the organic emission layer, and the reflector, and
   an image is output through the first surfaces and the polarizing film,
   wherein a width of a front non-display area exposed through the polarizing film is less than a thickness of the flexible substrate.

2. The multi-vision display apparatus of claim 1, wherein the TFT layer includes a plurality of TFTs; and
   the organic emission layer includes a plurality of organic light emitting diodes (OLEDs).

3. The multi-vision display apparatus of claim 2, wherein the reflector on the organic emission layer reflects light, emitted from the organic emission layer, in a direction toward the flexible substrate, and
   wherein the first surface of the flexible substrate is opposite the second surface of the flexible substrate.

4. The multi-vision display apparatus of claim 2, wherein each of the plurality of flexible display panels further comprises a passivation layer on the organic emission layer to protect the organic emission layer, and
   wherein a first surface of the passivation layer contacts the organic emission layer, and a second surface of the passivation layer is opposite the first surface of the passivation layer.

5. The multi-vision display apparatus of claim 4, wherein the non-display areas of each of the plurality of flexible display panels are bent in a direction toward a second surface of each of the plurality of flexible display panels and are attached to the second surface of each of the plurality of flexible display panels, and
   wherein the first surfaces of the plurality of flexible display panels are opposite the second surfaces of the plurality of flexible display panels.

6. The multi-vision display apparatus of claim 1, wherein the non-display areas of each of the plurality of flexible display panels are bent in a direction toward a second surface of each of the plurality of flexible display panels and are attached to the second surface of each of the plurality of flexible display panels, and
   wherein the first surfaces of the plurality of flexible display panels are opposite the second surfaces of the plurality of flexible display panels.

7. The multi-vision display apparatus of claim 1, wherein a portion of each of display areas of the plurality of flexible display panels is bent in a direction away from to the polarizing film along with the non-display areas and each of the flexible display panels are attached to another one of the flexible display panels.

* * * * *